(12) United States Patent  
Greisen et al.

(10) Patent No.: US 7,732,234 B2
(45) Date of Patent: Jun. 8, 2010

(54) FABRICATION PROCESS FOR PACKAGE WITH LIGHT EMITTING DEVICE ON A SUB-MOUNT

(75) Inventors: Christoffer Graae Greisen, Valby (DK); Matthias Heschel, Copenhagen (DK); Lior Shiv, Hilleroed (DK); Steen Weichel, Hoersholm (DK)

(73) Assignee: Hymite A/S, Alleroed (DK)

( * ) Notice: Subject to any disclaimer, the term of this patent is extended or adjusted under 35 U.S.C. 154(b) by 290 days.

(21) Appl. No.: 11/675,179

(22) Filed: Feb. 15, 2007

(65) Prior Publication Data

US 2008/0199982 A1 Aug. 21, 2008

(51) Int. Cl.
H01L 21/00 (2006.01)
H01L 21/50 (2006.01)
H01L 21/48 (2006.01)
H01L 21/44 (2006.01)

(52) U.S. Cl. .............................. 438/29; 438/26; 438/25; 438/48; 438/106

(58) Field of Classification Search .................... 438/25, 438/26, 29, 48, 106
See application file for complete search history.

(56) References Cited

U.S. PATENT DOCUMENTS

| | | | | |
|---|---|---|---|---|
| 6,531,328 B1 * | 3/2003 | Chen | ............................ | 438/26 |
| 7,165,896 B2 * | 1/2007 | Hauffe et al. | .................. | 385/88 |
| 7,247,940 B2 | 7/2007 | Höfer et al. | | |
| 7,411,225 B2 * | 8/2008 | Kim et al. | .................... | 257/100 |
| 2006/0001055 A1 | 1/2006 | Ueno et al. | | |
| 2006/0054910 A1 | 3/2006 | Takemori et al. | | |
| 2006/0208271 A1 | 9/2006 | Kim | | |
| 2008/0006837 A1 * | 1/2008 | Park et al. | ...................... | 257/98 |

FOREIGN PATENT DOCUMENTS

| | | | |
|---|---|---|---|
| EP | 1 253 650 A | | 10/2002 |
| EP | 1 605 524 A | | 12/2005 |
| EP | 1 744 376 A | | 1/2007 |
| EP | 1 876 653 A | | 1/2008 |

* cited by examiner

*Primary Examiner*—Luan C Thai
(74) *Attorney, Agent, or Firm*—Fish & Richardson P.C.

(57) ABSTRACT

A method of fabricating a package with a light emitting device includes depositing a first metallization to form a conductive pad on which the light emitting device is to be mounted and to form one or more feed-through interconnections extending through a semiconductor material that supports the conductive pad. Subsequently, a second metallization is deposited to form a reflective surface for reflecting light, emitted by the light emitting device, through a lid of the package. Deposition of the second metallization is de-coupled from deposition of the first metallization.

36 Claims, 5 Drawing Sheets

FABRICATION PROCESS FOR PACKAGE WITH LIGHT EMITTING DEVICE ON A SUB-MOUNT

TECHNICAL FIELD

This disclosure relates to a fabrication process for a package with a light emitting device on a sub-mount.

BACKGROUND

The design of packages that house a light emitting diode (LED) or other light emitting device is an important factor in optimizing the amount of light output from the package. LEDs often are housed in packages that include multiple components, which occupy an area much larger than the LED chip itself. To increase the amount of light emitted from the package, a reflective material, such as metallization, sometimes is provided on the inner surface of the package. To maximize the amount of light reflected out of the package, it is desirable to provide the reflective material over a significant part of the package interior.

In some packages, the LED chip is bonded to a thermally conductive pad. The metallization for the reflective mirror also may serve as part of a thin-film stack for the conductive pad and for plated through-wafer interconnections. Such processes, however, tend to complicate the fabrication process and reduce the amount of the package surface that can be used to reflect light out of the package.

SUMMARY

In one aspect, a method of fabricating a package with a light emitting device, such as a LED, includes depositing a first metallization to form a conductive pad on which the light emitting device is to be mounted and to form one or more feed-through interconnections extending through a semiconductor material that supports the conductive pad. Subsequently, a second metallization is deposited to form a reflective surface for reflecting light, emitted by the light emitting device, through a lid of the package. Deposition of the second metallization is de-coupled from deposition of the first metallization, which, in some cases, can increase the area covered by the reflective metallization, thereby increasing the amount of light reflected out of the package.

In some implementations, the first metallization is deposited so as to form respective overhangs around the top of the conductive pad and each of the feed-through interconnections. The second metallization is deposited over a surface of the semiconductor material such that the overhangs serve as shields to substantially prevent the second metallization from being deposited on areas directly below the overhangs. Such a technique allows the second metallization to form a reflective surface that is electrically disconnected from the conductive pad and the feed-through interconnections.

Some implementations include forming a cavity in a first side of a semiconductor wafer and forming one or more through-holes that extend from a bottom of the cavity to a second side of the wafer. The first metallization is deposited to form the conductive pad for mounting the light emitting device and to form feed-through interconnections that extend through the one or more through-holes. The first metallization is deposited so as to form overhangs around the top of the conductive pad and each of the feed-through interconnections. The second metallization is deposited over the first side of the semiconductor wafer including over bottom and side surfaces of the cavity and over top surfaces of the conductive pad and the feed-through interconnections. The overhangs serve as shields to substantially prevent the second metallization from being deposited on areas directly below the overhangs. The second metallization is removed selectively from top surfaces of the conductive pad and the feed-through interconnections, so that the remaining second metallization forms a reflective surface that is electrically disconnected from the conductive pad and the feed-through interconnections. The light emitting device then is mounted on the conductive pad.

The details of one or more embodiments of the invention are set forth in the accompanying drawings and the description below. Other features and advantages of the invention will be apparent from the detailed description, the accompanying drawings, and the claims.

DETAILED DESCRIPTION

Figure 1:
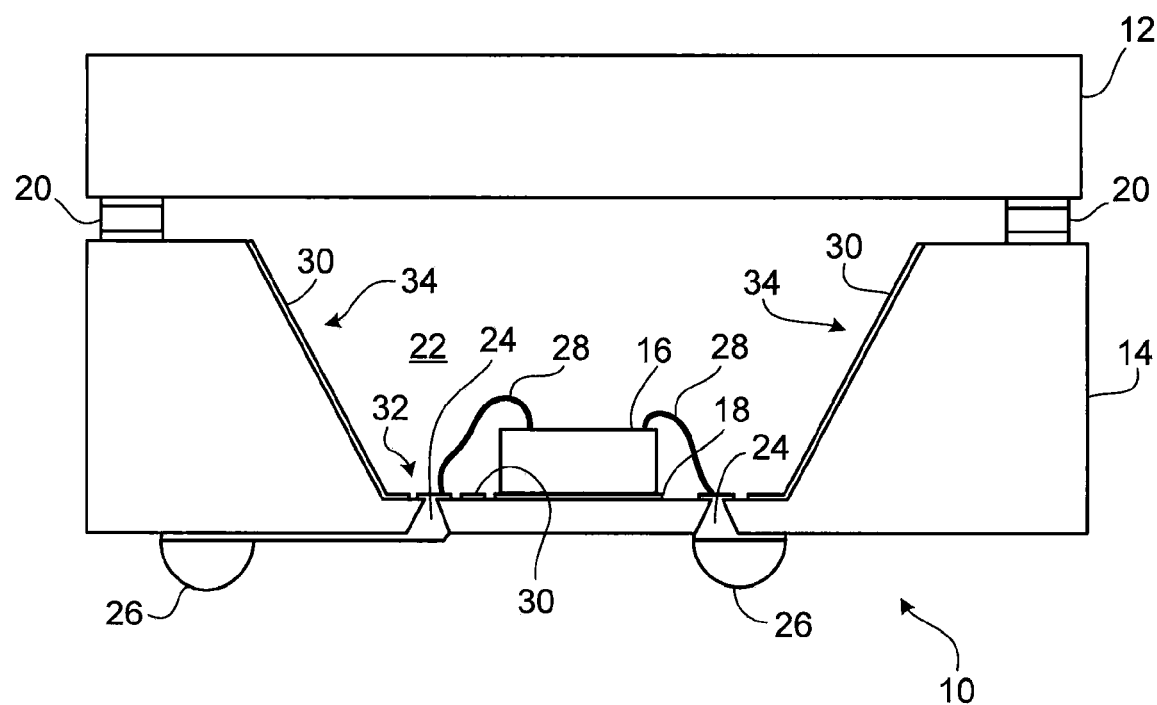
FIG. 1 is a cross-section of an example of a package that houses a light emitting device.

As illustrated in the example of FIG. 1, two structures 12, 14 are soldered together to provide a hermetically sealed package 10 that encapsulates a light emitting device, such as a LED 16. Techniques other than soldering may be used as well (e.g., but not limited to, anodic bonding and adhesive bonding). The upper structure 12 serves as a lid and is transparent to the wavelength(s) that are emitted by the LED 16.

In the illustrated example, the LED chip 16 is mounted on a conductive pad 18 on the lower structure 14, which serves as a base. A solder seal ring 20 is provided on the cavity-side surface of the base structure 14 for hermetically attaching the lid 12 to the base.

Figure 2:
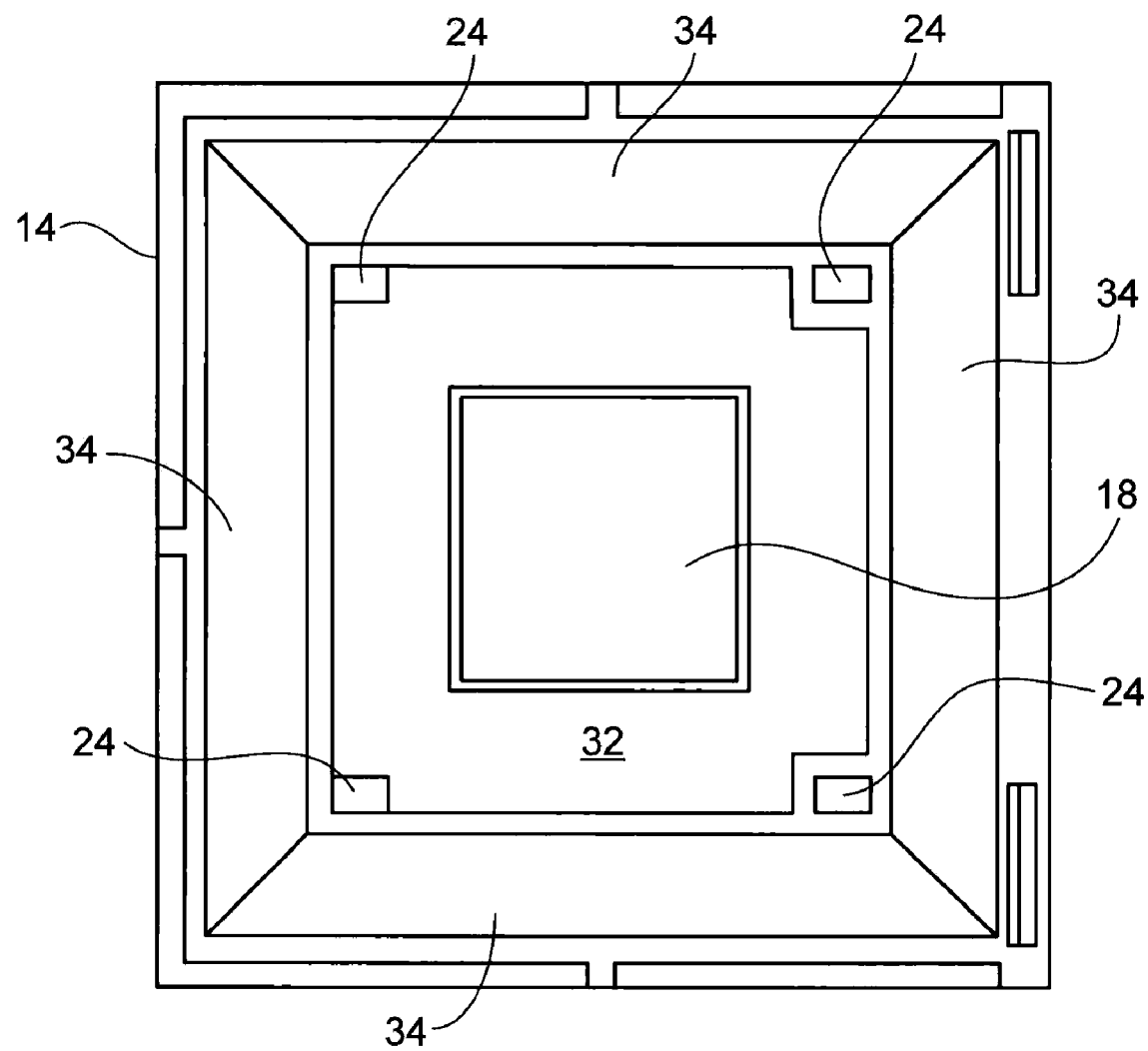
FIG. 2 is a top view of the base of the package.

FIG. 2 is a top view of the base 14 with the LED chip 16 removed.

As shown in FIGS. 1 and 2, the LED 16 is mounted within a recessed cavity 22 formed in the base 14, which also includes feed-through metallization 24. Other circuitry as well as passive components may be mounted in the recessed cavity 22 and encapsulated within the package. The feed-through metallization 24 extends through one or more micro-vias (i.e., through-holes) in the lower section of the base 14. As illustrated in the example of FIG. 1, the feed-through metallization 24 extends along the outer surface of the base 14 and may be electrically connected to solder bumps 26 for printed circuit board assembly. Wire bonds 28 may provide the electrical connections from the LED chip 16 to the feed-through metallization 24. Alternatively, the LED 16 may be flip-chip connected directly to the feed-through metallization 24. Metallization 30 also is provided on inner surfaces of the base 14, including the bottom 32 and sidewalls 34, and serves as a mirror to reflect additional light, emitted by the LED 16, through the lid 12.

The base 14 can be formed, for example, from a silicon wafer into which the recessed cavity 22 and through-holes for the feed-through metallization 24 are etched using standard techniques. For example, a double-sided etching technique can be used.

The metallization for the pad 18 and feed-through connections 24, as well as the mirror metallization 30, subsequently are deposited. As explained in greater detail below, deposition of the mirror metallization 30 is de-coupled from deposition of the metallization for the pad 18 and feed-through connections 24.

Figure 3:
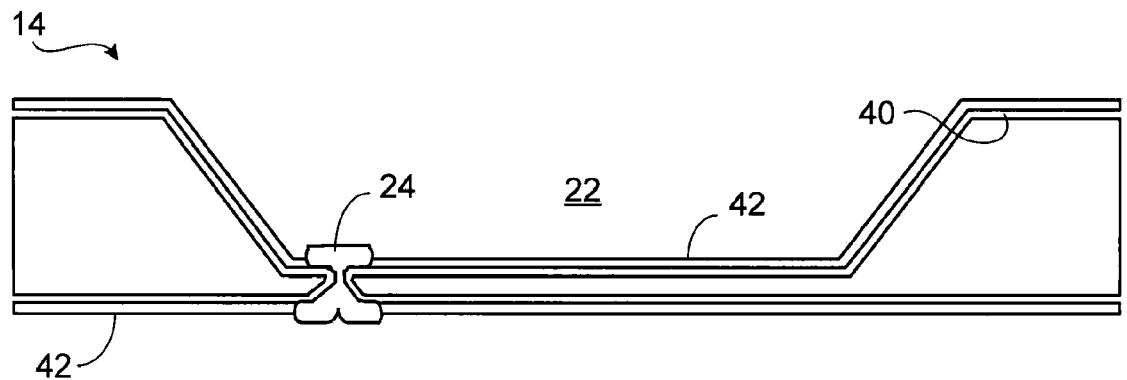
FIGS. 3 through 7 illustrate fabrication steps for depositing the various metallization layers.

FIGS. 3 through 7 illustrate fabrication steps for depositing the various metallization layers. As shown in FIG. 3, following etching of the cavity 22 and the through-holes for the feed-through metallization 24, and depositing or growing a passivation layer, a thin-film metallization stack 40 is deposited over the surfaces of the wafer, including in the cavity and the through-holes. In the illustrated example, the thin-film stack 40 includes layers of aluminum (Al), titanium (Ti), nickel (Ni) and gold (Au). Other implementations may include fewer than all the foregoing materials. Furthermore, additional, or different, materials may be included for the thin-film stack in other implementations.

Next, a thin plating mould 42 is provided over the surfaces of the silicon wafer other than the areas where the feed-through metallization 24 and conductive pad 18 are to be deposited. A photoresist mask can be used as the plating mould 42. Although FIGS. 3-7 illustrate an example with respect to the feed-through metallization 24, the same processes are used with respect to the pad metallization 18. The photoresist mask can be deposited by any of several techniques, including, for example, spin coating, dip coating, spray coating or electro-deposition.

Figure 8:
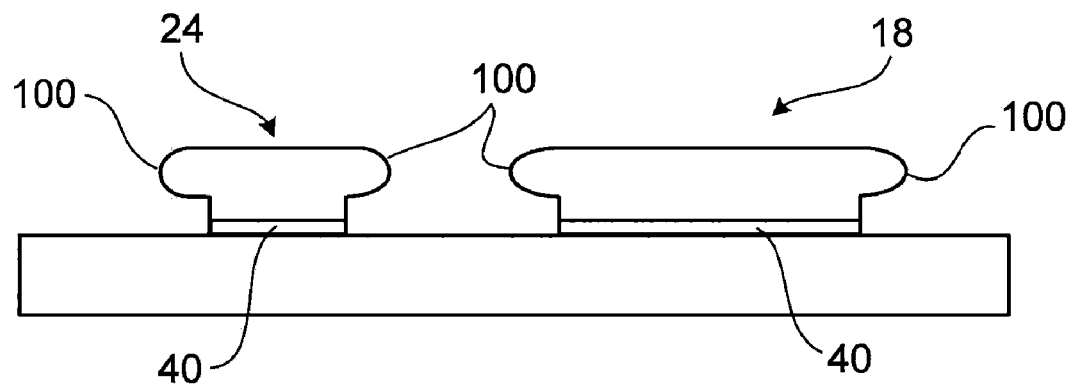
FIG. 8 is an enlarged view of overhangs at the top of feed-through and conductive pad metallization regions.

After depositing the plating mould 42, the metallization for the feed-through connections 24 and the pad 18 is deposited using, for example, an electroplating process. The electroplated metallization 18, 24 is deposited so that there is an overhang around the top of each conductor line and/or pad. An enlarged example of such an overhang 100 is illustrated in FIG. 8. During subsequent fabrication processes, the overhang 100 serves as a shield to prevent the mirror metallization 30 from being deposited too close to the side edges of the metallization for the feed-through connections 24 and the pad 18.

In the illustrated example, gold (Au) or gold-tin is used as the metallization for the feed-through connections 24 and the pad 18. Once the thickness of deposited gold exceeds the thickness of the plating mould 42, isotropic growth of the gold layer results in formation of the overhang 100. In the illustrated example, the thickness of the plating mould 42 is about 7-8 microns (μm), and the thickness of the gold metallization is about 10 μm. The thickness of the overhangs is about 2-3 μm. Similarly, in the illustrated example, the overhangs 100 extend about 2-3 μm beyond the lower portions of the metallization. In other implementations, those values may differ.

Figure 4:
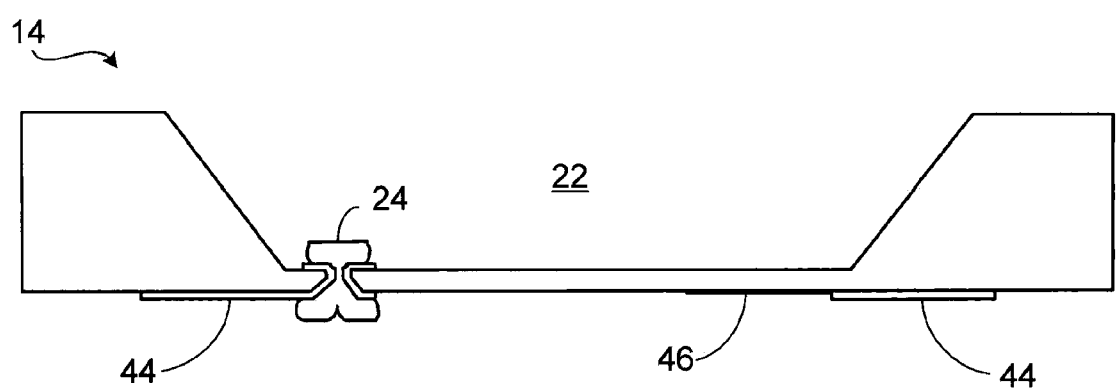

Next, as illustrated in FIG. 4, the plating mould 42 is removed, and the remaining thin-film stack 40 is patterned to form metal structures, such as a solder bond 44 and solder dam 46 on the backside of the silicon wafer. In the illustrated example, the solder bond 44 includes all the layers of the film-stack 40; the solder dam 46 includes the Al and Ti layers.

Figure 5:
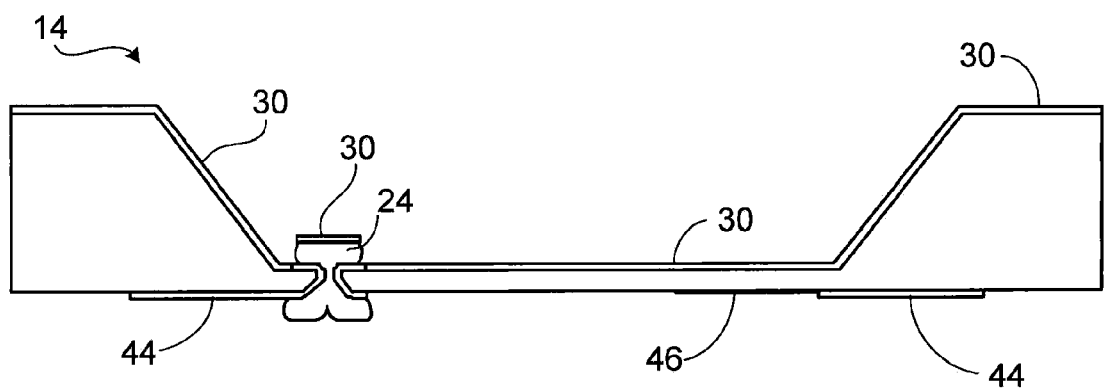
Figure 9:
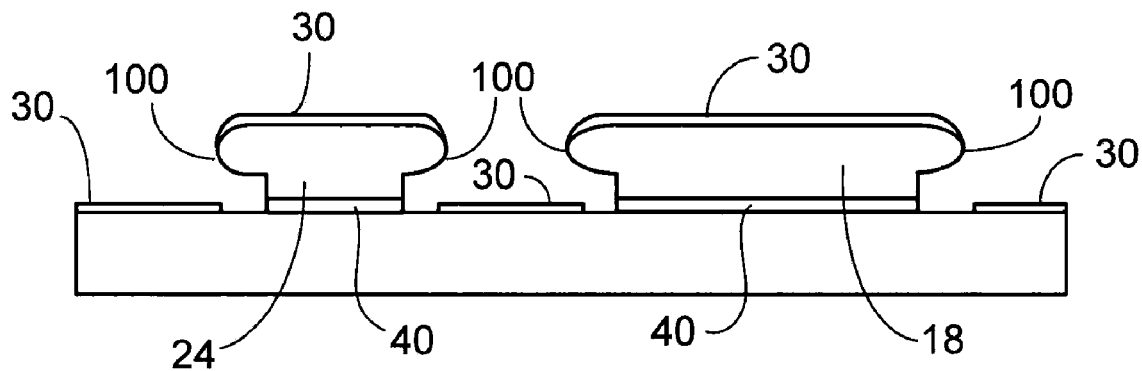
FIG. 9 illustrates how the overhangs shield areas adjacent the side edges of the feed-through and conductive pad metallization regions from being covered by subsequently deposited metallization.

Next, as shown in FIG. 5, the mirror metallization (e.g., aluminum) 30 is deposited on substantially all the exposed areas of the cavity-side of the base 14. Evaporation or sputtering techniques can be used to deposit the mirror metallization 30, which should have a final thickness that is less than the thickness of the lower portion of the metallization for the feed-through connections 24 and the conductive pad 18. In the illustrated example, the mirror metallization 30 has a thickness of about one hundred nanometers (nm). As illustrated in FIG. 5, the mirror metallization is deposited on the top of the overhangs 100 as well as on exposed areas of the cavity-side of the base 14. As mentioned above, however, and as illustrated more clearly in FIG. 9, the overhangs 100 for the feed-through connections 24 and the conductive pad 18 serve as shields and prevent the mirror metallization from being deposited too close to the edges of the feed-through connections 24 and the pad 18.

As is clear from the foregoing description, the process of depositing the mirror metallization 30 is de-coupled from the process of depositing the metallization for the feed-through connections 24 and the conductive pad 18. That can result in the mirror metallization 30 covering a large percentage of the interior surfaces of the base 14, while preventing the mirror metallization from contacting the side edges of the feed-through connections 24 and the pad 18.

Figure 6:
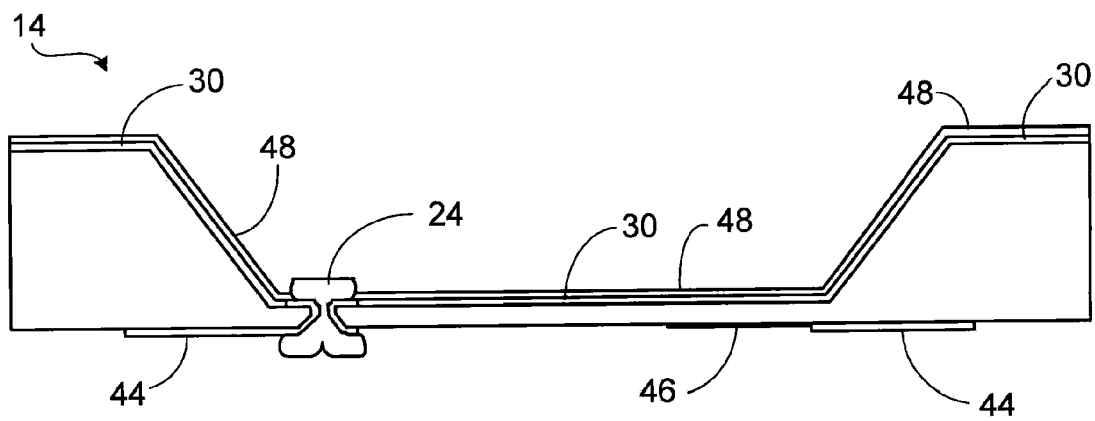

Next, as shown in FIG. 6, the aluminum mirror metallization 30 is removed from the gold plating layers 24, 18 (i.e., the aluminum is removed from the top of the feed-through connections 24 and the conductive pad 18). That can be achieved, for example, by selectively depositing a photoresist layer 48 (e.g., by an electro-deposition technique) on areas of the aluminum mirror metallization layer 30 other than on those areas where the aluminum mirror metallization layer is to be removed (i.e., other than on the feed-through connections 24 and the conductive pad 18). The exposed aluminum metallization on the tops of the gold (or gold-tin) feed-through connections 24 and the conductive pad 18 then can be removed by placing the silicon wafer in an aluminum etchant.

Figure 7:
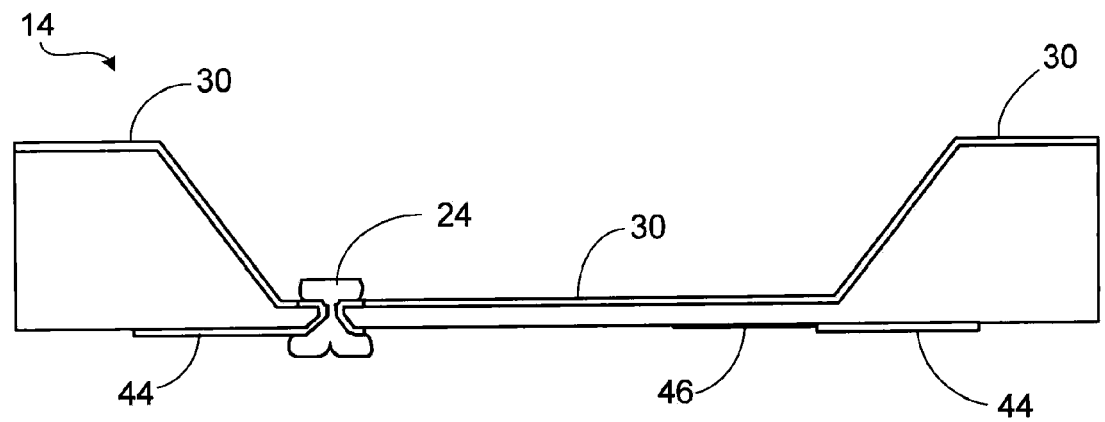

After removing the aluminum from the feed-through connections 24 and the conductive pad 18, the electro-deposited photoresist layer 48 is stripped, as shown in FIG. 7. The result is a semiconductor sub-mount for the LED chip with a significant portion of the inner surface covered by a reflective (mirror) metallization to enhance optical output. The mirror metallization is electrically disconnected from the conductor lines (i.e., the feed-through connections 24 and the conductive pad 18) as a result of the overhangs 100.

Although the foregoing description focuses on formation of the base 14 for a single package, the process can be performed as a batch process at the wafer level. After the various metallization layers have been deposited, the LED chip 16 is placed on the conductive pad 18, and the wire-bonds 28 are attached. The cavity 22 can be filled with a silicone gel, and the transparent lid 12, which can include a plastic or glass lens, is attached to the base 14.

Other implementations are within the scope of the claims.

What is claimed is:

1. A method of fabricating a package with a light emitting device on a sub-mount, the method comprising:
   depositing a first metallization to form a conductive pad on which the light emitting device is to be mounted and to form one or more feed-through interconnections extending through a semiconductor material that supports the conductive pad; and
   subsequently depositing a second metallization to form a reflective surface for reflecting light, emitted by the light emitting device, through a lid of the package,
   wherein depositing the second metallization is de-coupled from depositing the first metallization.

2. The method of claim 1 wherein the first metallization is deposited so as to form respective overhangs around the top of the conductive pad and each of the one or more feed-through interconnections.

3. A method of fabricating a package with a light emitting device on a sub-mount, the method comprising:

depositing a first metallization to form a conductive pad on which the light emitting device is to be mounted and to form one or more feed-through interconnections extending through a semiconductor material that supports the conductive pad, wherein the first metallization is deposited so as to form respective overhangs around the top of the conductive pad and each of the one or more feed-through interconnections;

subsequently depositing a second metallization to form a reflective surface for reflecting light, emitted by the light emitting device, through a lid of the package, wherein depositing the second metallization is de-coupled from depositing the first metallization, and wherein depositing the second metallization includes depositing the second metallization over a surface of the semiconductor material including over top surfaces of the conductive pad and the one or more feed-through interconnections, wherein the overhangs serve as shields to substantially prevent the second metallization from being deposited on areas directly below the overhangs; and subsequently removing the second metallization from top surfaces of the conductive pad and the one or more feed-through interconnections.

4. The method of claim 3 including depositing the second metallization over substantially an entire side of the semiconductor material.

5. The method of claim 3 wherein the overhangs are formed through isotropic growth of the first metallization.

6. The method of claim 5 including:
providing a mask layer over a surface of the semiconductor material, the mask layer defining openings where the first metallization for the conductive pad and the one or more feed-through interconnections is to be deposited; and
subsequently depositing the first metallization, wherein the isotropic growth of the first metallization occurs when a thickness of the first metallization exceeds a thickness of the mask layer.

7. The method of claim 6 wherein the mask layer comprises photoresist.

8. The method of claim 7 wherein the photoresist is deposited by spin coating.

9. The method of claim 7 wherein the photoresist is deposited by dip coating.

10. The method of claim 7 wherein the photoresist is deposited by spray coating.

11. The method of claim 7 wherein the photoresist is deposited by electro-deposition.

12. The method of claim 3 wherein the first metallization is deposited by an electroplating process and the second metallization is deposited by an evaporation technique.

13. The method of claim 3 wherein the first metallization is deposited by an electroplating process and the second metallization is deposited by an sputtering technique.

14. The method of claim 3 wherein the overhangs extend on the order of a few microns beyond respective lower portions of the conductive pad and the one or more feed-through interconnections.

15. The method of claim 3 wherein removing the second metallization from top surfaces of the conductive pad and the one or more feed-through interconnections includes:
selectively providing a photoresist layer on areas of the second metallization other than areas of the second metallization that are to be removed; and
etching exposed areas of the second metallization.

16. The method of claim 3 wherein the first metallization comprises gold and the second metallization comprises aluminum.

17. The method of claim 3 wherein the first metallization comprises gold and tin, and the second metallization comprises aluminum.

18. The method of claim 3 including etching a cavity in the semiconductor material, wherein the conductive pad and the one or more feed-through interconnections are formed in an area defined by the cavity, and wherein the second metallization is deposited on a bottom surface of the cavity and along sidewalls of the cavity.

19. The method of claim 3 performed as a batch process at a semiconductor wafer level.

20. A method of fabricating a package to house a light emitting device, the method comprising:
forming a cavity in a first side of a semiconductor wafer and forming one or more through-holes that extend from a bottom of the cavity to a second side of the wafer;
depositing a first metallization to form a conductive pad for mounting the light emitting device and to form feed-through interconnections that extend through the one or more through-holes, wherein the first metallization is deposited so as to form respective overhangs around the top of the conductive pad and each of the feed-through interconnections;
depositing a second metallization over the first side of the semiconductor wafer including over bottom and side surfaces of the cavity and over top surfaces of the conductive pad and the feed-through interconnections, wherein the overhangs serve as shields to substantially prevent the second metallization from being deposited on areas directly below the overhangs;
selectively removing the second metallization from top surfaces of the conductive pad and the feed-through interconnections, so that the remaining second metallization forms a reflective surface that is electrically disconnected from the conductive pad and the feed-through interconnections; and
mounting the light emitting device on the conductive pad.

21. The method of claim 20 wherein the overhangs are formed through isotropic growth of the first metallization.

22. The method of claim 21 including:
providing a mask layer over the first side of the semiconductor material, the mask layer defining openings where the first metallization for the conductive pad and the feed-through interconnections is to be deposited; and
subsequently depositing the first metallization, wherein the isotropic growth of the first metallization occurs when a thickness of the first metallization exceeds a thickness of the mask layer.

23. The method of claim 20 wherein the first metallization is deposited by an electroplating process and the second metallization is deposited by an evaporation technique.

24. The method of claim 20 wherein the first metallization is deposited by an electroplating process and the second metallization is deposited by a sputtering technique.

25. The method of claim 20 wherein the overhangs extend on the order of a few microns beyond respective lower portions of the conductive pad and the feed-through interconnections.

26. The method of claim 20 wherein the first metallization comprises gold and the second metallization comprises aluminum.

27. The method of claim 20 wherein the first metallization comprises gold and tin, and the second metallization comprises aluminum.

28. The method of claim 20 including mounting a light emitting diode on the conductive pad.

29. The method of claim 28 including electrically coupling the light emitting diode to the feed-through interconnections and attaching a transparent lid over the light emitting diode.

30. A method of fabricating a package with a light emitting device on a sub-mount, the method comprising:
depositing a first metallization to form a conductive pad on which the light emitting device is to be mounted and to form one or more feed-through interconnections extending through a semiconductor material that supports the conductive pad, wherein the first metallization is deposited so as to form respective overhangs around the top of the conductive pad and each of the one or more feed-through interconnections, and wherein each overhang extends beyond a respective lower portion of the conductive pad or one of the feed-through interconnections such that there is an empty space immediately below the overhang; and
subsequently depositing a second metallization to form a reflective surface for reflecting light, emitted by the light emitting device, through a lid of the package, wherein depositing the second metallization is de-coupled from depositing the first metallization.

31. The method of claim 20 wherein each overhang extends beyond a respective lower portion of the conductive pad or one of the feed-through interconnections such that there is an empty space immediately below the overhang.

32. The method of claim 30 wherein the overhangs are formed through isotropic growth of the first metallization.

33. The method of claim 32 including:
providing a mask layer over a surface of the semiconductor material, the mask layer defining openings where the first metallization for the conductive pad and the one or more feed-through interconnections is to be deposited; and
subsequently depositing the first metallization, wherein the isotropic growth of the first metallization occurs when a thickness of the first metallization exceeds a thickness of the mask layer.

34. The method of claim 30 wherein the first metallization is deposited by an electroplating process and the second metallization is deposited by an evaporation or sputtering technique.

35. The method of claim 30 wherein the overhangs extend on the order of a few microns beyond respective lower portions of the conductive pad and the one or more feed-through interconnections.

36. The method of claim 30 including selectively removing the second metallization from top surfaces of the conductive pad and the feed-through interconnections, so that the remaining second metallization forms a reflective surface that is electrically disconnected from the conductive pad and the feed-through interconnections.

* * * * *